(12) United States Patent
Ogi et al.

(10) Patent No.: US 11,313,716 B2
(45) Date of Patent: Apr. 26, 2022

(54) VIBRATION DETECTION ELEMENT AND METHOD FOR MANUFACTURING THE SAME

(71) Applicant: OSAKA UNIVERSITY, Suita (JP)

(72) Inventors: Hirotsugu Ogi, Suita (JP); Tomoyuki Nonaka, Kyoto (JP); Fumihito Kato, Kawaguchi (JP)

(73) Assignee: OSAKA UNIVERSITY, Osaka (JP)

( * ) Notice: Subject to any disclaimer, the term of this patent is extended or adjusted under 35 U.S.C. 154(b) by 306 days.

(21) Appl. No.: 16/635,753

(22) PCT Filed: Jun. 21, 2018

(86) PCT No.: PCT/JP2018/023549
§ 371 (c)(1),
(2) Date: Jan. 31, 2020

(87) PCT Pub. No.: WO2019/026456
PCT Pub. Date: Feb. 7, 2019

(65) Prior Publication Data
US 2021/0123799 A1 Apr. 29, 2021

(30) Foreign Application Priority Data
Aug. 1, 2017 (JP) .............................. JP2017-148793

(51) Int. Cl.
*G01H 11/08* (2006.01)
*G01H 13/00* (2006.01)
(Continued)

(52) U.S. Cl.
CPC ............... *G01H 11/08* (2013.01); *B81B 3/00* (2013.01); *G01H 13/00* (2013.01);
(Continued)

(58) Field of Classification Search
CPC .......... B81B 3/00; G01H 11/08; G01H 13/00; G01N 29/022; G01N 5/02; H01L 41/313; H01L 41/332; H01L 41/337
See application file for complete search history.

(56) References Cited

U.S. PATENT DOCUMENTS 7,802,356 B1    9/2010  Chang et al.
2002/0066524 A1* 6/2002  Kagawa ................ H01L 41/331
                                                        156/241

(Continued)

FOREIGN PATENT DOCUMENTS

JP    2001-156580 A    6/2001
JP    2008-026099 A    2/2008
(Continued)

OTHER PUBLICATIONS

Kato et al, Multi-Channel Wireless Quartz Crystal Microbalance Biosensor Fabricated With Poly(Dimethylsiloxane), Transducers 2017, Kaohsiung, Taiwan, Jun. 18-22, 2017 (Year: 2017).*
(Continued)

*Primary Examiner* — David L Singer
(74) *Attorney, Agent, or Firm* — Keating and Bennett, LLP

(57) ABSTRACT

A vibration detection element includes substrates, support members, and an oscillator, and may be used as a biosensor and/or for liquid inspection by analysis of oscillator resonant frequency change. The substrates have a space portion, and the support members protrude from the surfaces of the respective substrates into the space portion. The oscillator is disposed between the support members and is capable of vibrating in the space portion. The support members may each include multiple supports which prevent the oscillator from contacting the substrate surfaces. During manufacturing the oscillator may be transferred from the support member of a glass flow path substrate to a silicon flow path
(Continued)

substrate by placement of the silicon substrate support member against the oscillator and subsequent removal of the adhesive from the glass substrate support member.

18 Claims, 14 Drawing Sheets

(51) Int. Cl.
    *H01L 41/313*     (2013.01)
    *H01L 41/332*     (2013.01)
    *H01L 41/337*     (2013.01)
    *B81B 3/00*     (2006.01)
    *G01N 29/02*     (2006.01)
    *G01N 5/02*     (2006.01)

(52) U.S. Cl.
    CPC ......... *G01N 29/022* (2013.01); *H01L 41/313* (2013.01); *H01L 41/332* (2013.01); *H01L 41/337* (2013.01); *G01N 5/02* (2013.01); *G01N 2291/014* (2013.01); *G01N 2291/0255* (2013.01)

(56) References Cited

U.S. PATENT DOCUMENTS

2012/0148448 A1* 6/2012 Kulah .................. G01G 3/16
    422/69
2012/0195797 A1    8/2012 Sparks et al.
2012/0318052 A1* 12/2012 Ogi ..................... G01N 29/022
    73/64.53
2015/0362464 A1* 12/2015 Tanaka ................ G01N 29/022
    73/649

FOREIGN PATENT DOCUMENTS

| JP | 2010185772 A | * | 8/2010 |
| JP | 4981998 B2 | | 7/2012 |
| JP | 2013-502577 A | | 1/2013 |
| JP | 2014002014 A | * | 1/2014 |
| JP | 2016-180767 A | | 10/2016 |
| JP | 6001342 B2 | | 10/2016 |
| WO | WO-2017052646 A1 | * | 3/2017 |

OTHER PUBLICATIONS

Ogi et al., 170 MHz Electrodeless Quartz Crystal Microbalance for Highly Sensitive Biosensors, 2009 IEEE International Ultrasonics Symposium Proceedings (Year: 2009).*

Official Communication issued in International Patent Application No. PCT/JP2018/023549, dated Aug. 28, 2018.

McCann et al., "The Detection of Chemical and Biological Analytes Using a Monolithic Spiral Coil Acoustic Transduction Sensor", IEEE International Ultrasonics Symposium Proceedings, Digital Object Identifier: 10.1109/ULTSYM.2008.0286, 2008, pp. 1187-1190.

* cited by examiner (B1-7) SILICON SUBSTRATE ETCHING (XeF$_2$)

(B1-8) O$_2$ ASHING (B1-9) PHOTOLITHOGRAPHY (B1-10) QUARTZ ETCHING (B1-11) REMOVE HEAT-RESISTANT ADHESIVE (B2-7) O$_2$ ASHING (B2-8) APPLY HEAT-RESISTANT ADHESIVE
(APPLICATION WITH DISPENSER OR PATTERNING
COATING BY SPIN-COATING AND
PHOTOLITHOGRAPHY, FOLLOWED BY CURING)

(B2-9) JOIN GLASS FLOW PATH SUBSTRATE
(HOT PRESSING IN VACUUM)

(B2-10) SILICON SUBSTRATE ETCHING
(XeF$_2$)

(B2-11) O$_2$ ASHING (B3-6) APPLY HEAT-RESISTANT ADHESIVE (B3-7) JOIN GLASS FLOW PATH SUBSTRATE
(HOT PRESSING IN VACUUM)

(B3-8) SILICON SUBSTRATE ETCHING
($XeF_2$)

(B3-9) $O_2$ ASHING (C-8) O$_2$ ASHING (C-9) SILICON ETCHING
(SF$_6$, C$_4$F$_8$)

(C-10) TEOS FILM ETCHING
(BUFFERED HYDROFLUORIC ACID)

(D1-1) JOIN GLASS AND SILICON FLOW PATH SUBSTRATES BY ANODIC BONDING (D1-2) REMOVE HEAT-RESISTANT ADHESIVE (D2-1) JOIN GLASS AND SILICON FLOW PATH SUBSTRATES BY ANODIC BONDING (D2-2) REMOVE HEAT-RESISTANT ADHESIVE

VIBRATION DETECTION ELEMENT AND METHOD FOR MANUFACTURING THE SAME

TECHNICAL FIELD

The present invention relates to a vibration detection element and a method for manufacturing the same.

BACKGROUND ART

A conventional vibration detection element as disclosed in Japanese Patent No. 6001342 has been known. The vibration detection element disclosed in Japanese Patent No. 6001342 includes cover members A, B, and C, an oscillator, a vibrating space, and a micro space. The cover members A, B, and C are laminated upon each other so that the cover member B is in contact with the cover member A and C and is disposed between the cover members A and C.

The vibrating space and the micro space are formed between the laminated cover members A, B, and C. The micro space is open to the vibrating space. The oscillator is placed in the vibrating space to have its edge inserted in the micro space and the edge is in contact with the cover member B.

SUMMARY OF INVENTION

However, in the vibration detection element disclosed in Japanese Patent No. 6001342, when the oscillator having a thickness less than 10 µm, the oscillator deflects to contact the cover members A and C which form the vibration space and can no longer vibrate.

In addition, the vibration detection element disclosed in Japanese Patent No. 6001342 is manufactured by the steps of forming an oscillator having a desired size and a desired thickness by etching or mechanical polishing and placing an edge of the formed oscillator in contact with the cover members which define the micro-space, and therefore when the oscillator is thinner than 10 µm, the oscillator may be damaged.

Therefore, according to an embodiment of the present invention, a vibration detection element including an oscillator having a thickness less than 10 µm and still capable of vibrating is provided.

Furthermore, a method for manufacturing a vibration detection element provided according to the embodiment of the present invention allows a vibration detection element to be manufactured while preventing damages to a thin oscillator having a thickness less than 10 µm.

Feature 1

A method for manufacturing a vibration detection element according to an embodiment of the present invention includes a first step including joining a first substrate having an oscillator adhered with a heat-resistant adhesive to a first support member protruding from a bottom surface of a first recess of the first substrate and a second substrate having a second support member protruding from a bottom surface of a second recess of the second substrate so that the oscillator is opposed to the second support member, and a second step removing the heat-resistant adhesive after the first step.

Feature 2

In feature 1, the first step includes a first sub step producing the first substrate having the oscillator adhered to the first support member with the heat-resistant adhesive using a third substrate to which the oscillator is adhered, and a second sub step joining the first substrate and the second substrate after the first sub step so that the oscillator is opposed to the second support member.

Feature 3

In feature 2, the first sub step includes a sub step A forming the first recess and the first support member at the first substrate, and a sub step B including adhering the oscillator to the third substrate, applying the heat-resistant adhesive on an exposed surface of the oscillator, and adhering the oscillator to the first support member with the applied heat-resistant adhesive. The second sub step includes a sub step C forming the second recess and the second support member at the second substrate, and a sub step D joining the first substrate and the second substrate after the sub step B so that the exposed surface of the oscillator is opposed to the second support member.

Feature 4

In feature 3, in the sub step D, the first substrate and the second substrate are joined so that the exposed surface of the oscillator is opposed to the second support member in a space formed by the first and second recesses.

Feature 5

In feature 3 or 4, the sub step B includes a sub step B-1 adhering a piezoelectric plate to the third substrate by an adhesive layer, a sub step B-2 polishing the piezoelectric plate into a desired thickness, a sub step B-3 including applying the heat-resistant adhesive on a surface of the polished piezoelectric plate after the sub step B-2 and curing the applied heat-resistant adhesive, a sub step B-4 joining the first substrate and the second substrate by hot pressing after the sub step B-3 so that the heat-resistant adhesive is in contact with a surface of the first substrate and a surface of the first support member, a sub step B-5 removing the third substrate and the adhesive layer after the sub step B-4, and a sub step B-6 including patterning the polished piezoelectric plate into a desired shape and producing the oscillator adhered to the first support member with the heat-resistant adhesive after the sub step B-5.

Feature 6

In feature 3 or 4, the sub step B includes a sub step B-1 including adhering the piezoelectric plate on a surface of the third substrate by an adhesive layer, polishing the adhered piezoelectric plate into a desired thickness, and patterning the piezoelectric plate into a desired shape, thereby producing the oscillator, a sub step B-2 including applying a heat-resistant adhesive on a surface of the oscillator and curing the applied heat-resistant adhesive, a sub step B-3 joining the first substrate and the third substrate by hot pressing after the sub step B-2 so that the oscillator is positioned on the first support member, and a sub step B-4 removing the third substrate and the adhesive layer after the sub step B-3.

Feature 7

In feature 6, the sub step B further includes a sub step B-5 patterning the heat-resistant adhesive after the sub step B-2 so that only the part of the heat-resistant adhesive opposed to the first support member remains, and the sub step B-3 is performed after the sub step B-5.

Feature 8

In anyone of features 5 to 7, the adhesive layer includes an organic material or an inorganic material.

Feature 9

In any one of claims 5 to 8, the hot pressing is performed in a nitrogen atmosphere or in a vacuum.

Feature 10

In any one of features 1 to 9, the heat-resistant adhesive includes a single organic material or an organic material containing particles having a particle size from tens of nm to hundreds of nm.

Feature 11

In any one of features 1 to 10, in the second step, the heat-resistant adhesive is removed by one of a basic solution, an acidic solution, and an organic solution.

Feature 12

A vibration detection element according to the embodiment of the present invention includes a substrate, a first support member, a second support member, and an oscillator. The substrate includes a space portion having a first surface and a second surface opposed to the first surface. The first support member protrudes from the first surface toward the second surface of the space portion. The second support member protrudes from the second surface toward the first surface of the space portion. The oscillator is disposed in contact with the first support member or the second support member and capable of vibrating in the space portion and has a thickness less than 10 μm. The first and second support members each include multiple supports which prevent the oscillator from contacting the first surface or the second surface.

Advantageous Effects of Invention

An oscillator having a thickness less than 10 μm can vibrate. A vibration detection element can be manufactured while preventing damages to a thin oscillator having a thickness less than 10 μm.

DESCRIPTION OF EMBODIMENTS

Figure 1:
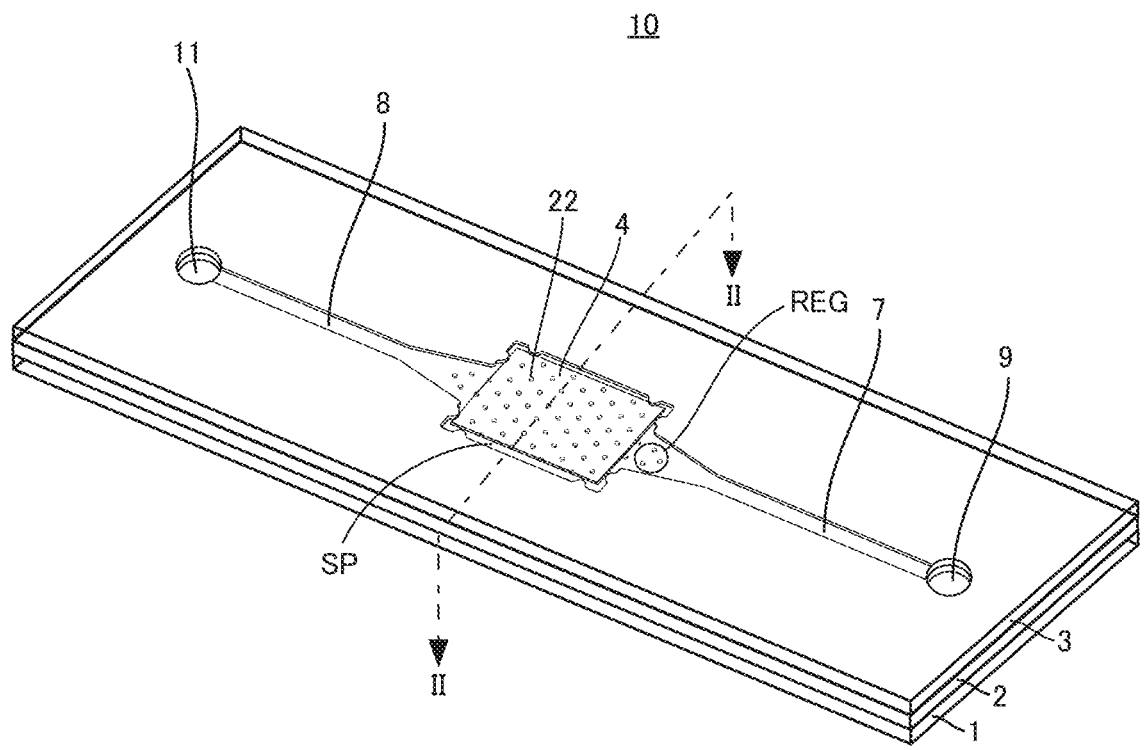
FIG. 1 is a perspective view of a vibration detection element according to an embodiment of the present invention.

Embodiments of the present invention will be described in detail with reference to the drawings. Note that the same or corresponding portions in the drawings are denoted by the same reference characters and their description will not be repeated.

Figure 2:
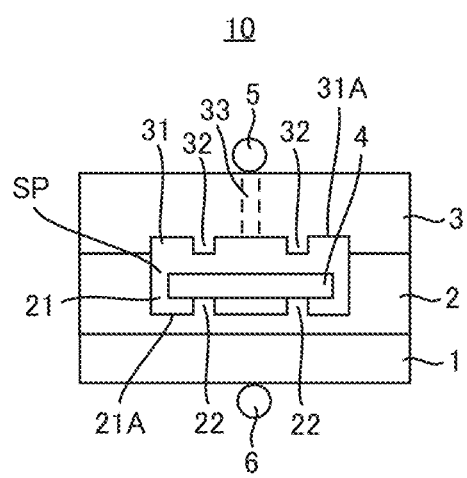
FIG. 2 is a sectional view of the vibration detection element taken along line II-II in FIG. 1.

FIG. 1 is a perspective view of a vibration detection element according to an embodiment of the present invention. FIG. 2 is a sectional view of the vibration detection element taken along line II-II shown in FIG. 1. FIG. 1 does not show antennas.

With reference to FIGS. 1 and 2, the vibration detection element 10 according to the embodiment of the present invention includes substrates 1 to 3, an oscillator 4, and antennas 5 and 6.

The substrate 2 has a recess 21 and a support member 22. The substrate 3 has a recess 31, a support member 32, and a feed/discharge port 33. The support member 22 protrudes from the bottom surface 21A of the recess 21 toward the bottom surface 31A of the recess 32. The support member 32 protrudes from the bottom surface 31A of the recess 31 toward the bottom surface 21A of the recess 21. The recess 31 of the substrate 3 is opposed to the recess 21 of the substrate 2. Each of the support members 22 and 32 may have a cylindrical shape. The feed/discharge port 33 passes through the substrate 3 in a thickness-wise direction from the outer surface of the substrate 3 to the bottom surface 31A of the recess 31.

The substrate 1 is joined to one surface of the substrate 2 by anodic bonding. The substrate 3 is joined to the other surface of the substrate 2 by anodic bonding so that the recess 31 is opposed to the recess 21. As a result, the recesses 21 and 31 form a space portion SP.

For example, the oscillator 4 has a square flat shape and is made of a quartz crystal. The oscillator 4 is disposed in contact with the support member 22 (or the support member 32) in the space portion SP. FIG. 2 shows two support members 22, but in practice, as shown in FIG. 1, more than two support members 22 are formed in the recess 21. The same applies to the support members 32. N1 support members 22 and N2 support members 32 are provided. N1 and N2 each represent the numbers of these members that can prevent the oscillator 4 from contacting the bottom surface 21A of the recess 21 or the bottom surface 31A of the recess 31 because of deflection. The specific value for N1 is determined in consideration of the distance between the support members 22 so that the oscillator 4 can be prevented from contacting the bottom surface 21A of the recess 21 by deflection, and the specific value for N2 is determined in consideration of the distance between the support members 32 so that the oscillator 4 can be prevented from contacting the bottom surface 31A of the recess 31 by deflection. Note that N1 and N2 may be the same or different from each other.

The support member 22 formed in a region REG functions to let a solution for inspection flow from a flow path to the entire region of the space portion SP. More specifically, the support member 22 formed in the region REG functions so that the solution to be inspected does not pass near the center of the space portion SP to flow into a flow path 8, but the solution to be inspected spreads toward the inside surface of the oscillator 4, passes through the space portion SP, and flows into the flow path 8. In this case, in the region REG, the support members 22 are arranged so that the number of the disposed members increases from the flow path 7 to the space portion SP.

The substrates 2 and 3 are joined to form the flow paths 7 and 8 and to form an introduction port 9 and a discharge port 11.

One end of the flow path 7 communicates with the introduction port 9 and the other end communicates with the space portion SP. The flow path 8 communicates with the discharge port 11 at one end and with the space portion SP at the other end. The introduction port 9 communicates with one end of the flow path 7. The discharge port 11 communicates with one end of the flow path 8.

Each of the substrates 1 and 3 is made for example of glass. The substrate 2 is made for example of silicon (Si). The thickness of the oscillator 4 is typically thinner than 10 μm, e.g., 3 μm.

Each of the antennas 5 and 6 includes a copper wire having a diameter of for example 0.2 mm φ to 1 mm φ. The antenna 5 is disposed on the substrate 3 and in contact with the substrate 3. The antenna 6 is positioned below the substrate 1 and in contact with the substrate 1. In this manner, the antenna 6 is positioned opposite to the antenna 5 with respect to the oscillator 4.

The oscillator 4 vibrates when an electromagnetic field is applied by the antenna 5. The antenna 5 applies an electromagnetic field to oscillator 4. The antenna 6 receives a reception signal consisting of a vibration signal when the oscillator 4 vibrates due to the application of the electromagnetic field.

In this manner, the vibration detection element 10 vibrates the oscillator 4 without using an antenna connected to a ground potential and detects the vibration of the oscillator 4 in a non-contact manner.

Note that the antennas 5 and 6 need not be arranged to oppose each other and may be arranged to oppose the oscillator 4. For example, the antenna 5 may be disposed on the left side of the center of the oscillator 4 in the width direction on the paper sheet of FIG. 2, and the antenna 6 may be disposed on the right side of the center of the oscillator 4 in the width direction on the paper sheet of FIG. 2, or vice versa.

In the left-right direction on the paper sheet of FIG. 2, the position of the support member 22 is illustrated to be the same as the position of the support member 32, but the position of the support member 22 is not limited to this according to the embodiment of the present invention and may be in a different position from the position of the support member 32 in the left-right direction on the paper sheet of FIG. 2.

Figure 3:
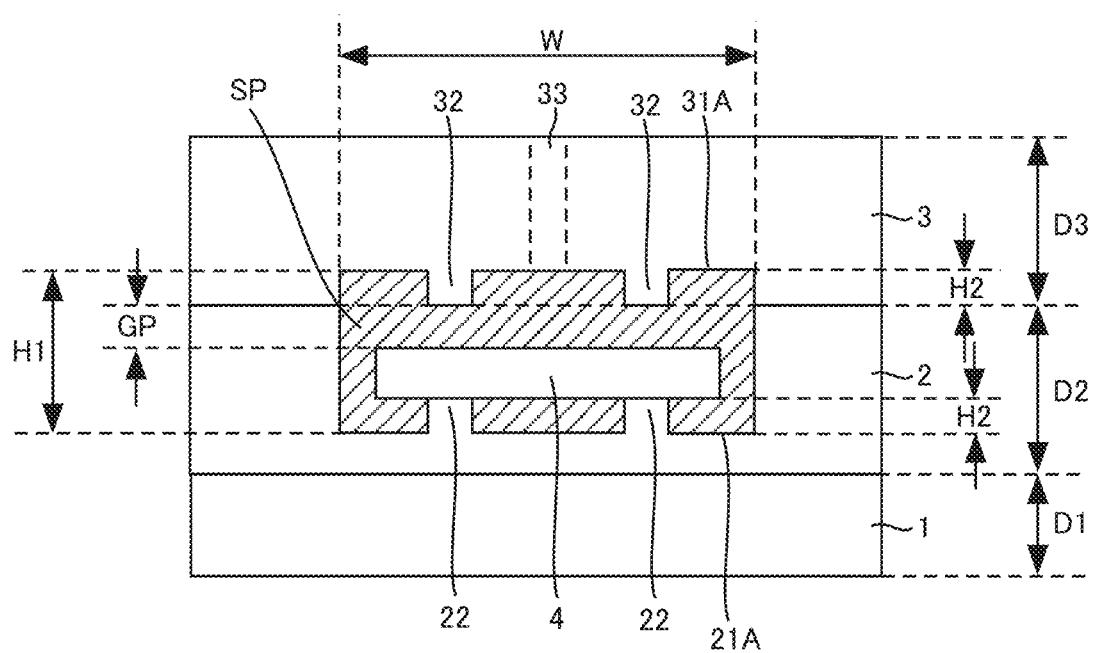
FIG. 3 is an enlarged view of a space portion shown in FIG. 2 and its periphery.

FIG. 3 is an enlarged view of the space portion SP shown in FIG. 2 and its periphery. With reference to FIG. 3, for example, the thickness D1 of substrate 1 is 250 μm, the thickness D2 of the substrate 2 is 60 μm, and the thickness D3 of the substrate 3 is 250 μm.

The width W of the space portion SP (the shaded part in FIG. 3) is for example 2 mm, and the height H1 of the space portion SP is for example 85 μm. The length of the space portion SP in a direction perpendicular to the sheet surface of FIG. 3 is for example 2.9 mm. The height H2 of the support members 22 and 32 is for example 30 μm and the diameter of the support members 22 and 32 is for example 30 μm. The distance GP between the oscillator 4 and the support member 32 is for example 20 μm.

Note that the height of the support member 22 may be different from the height of the support member 32, and the diameter of the support member 22 may be different from the diameter of the support member 32. The shape of the support members 22 and 32 is not limited to the cylindrical shape but may be a tubular shape having a polygonal cross-sectional shape taken in a direction perpendicular to the length-wise direction. The shape of the support member 22 may be different from the shape of the support member 32. Further, the support member 22 may have such a cross-sectional shape that its tip end in a longitudinal cross-sectional shape protrudes toward the support member 32, and the support member 32 may have such a cross-sectional shape that its tip end in a longitudinal cross-sectional shape protrudes toward the support member 22. The protrusions of the tip ends of the support members 22 and 32 allow the oscillator 4 and the support members 22 and 32 to contact in an approximately point-contacting manner, which can facilitate vibration of the oscillator 4. As a result, the detection sensitivity in detecting a target object can be improved.

For example, the oscillator 4 has a length of 1.7 mm in the left-right direction on the sheet surface of FIG. 3, and has a length of 2.5 mm in a direction perpendicular to the sheet surface of FIG. 3.

Since in FIG. 3, the glass substrate 1 is disposed below the glass substrate 3, the oscillator 4 is in contact with the support member 22 of the silicon substrate 2, while when the glass substrate 1 and the glass substrate 3 shown in FIG. 3 are reversed, the oscillator 4 is in contact with the support member 32 of the glass substrate 3, and the distance between the oscillator 4 and the support member 22 is for example 20 μm.

As described above, the oscillator 4 is held in contact with the support member 22 or the support member 32 without contacting the bottom surface 21A of the recess 21 or the bottom surface 31A of the recess 31 in the space portion SP, so that the oscillator can vibrate stably.

Figure 4:
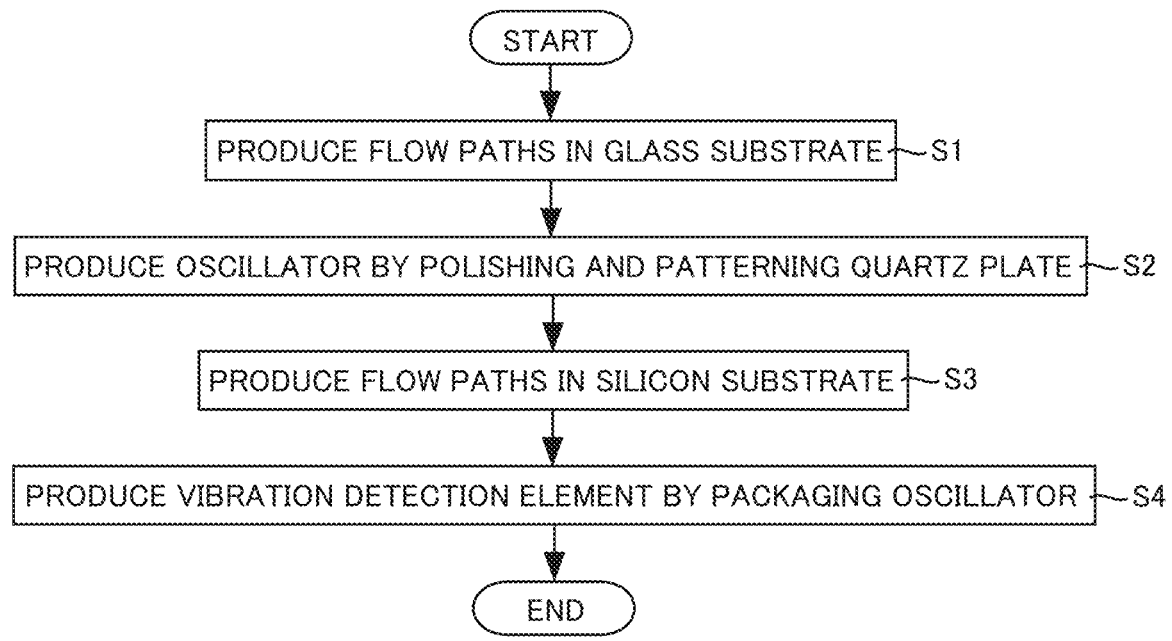
FIG. 4 is a process chart for illustrating a method for manufacturing the vibration detection element shown in FIGS. 1 and 2.

FIG. 4 is a flowchart for illustrating a method for manufacturing the vibration detection element 10 shown in FIGS. 1 and 2. With reference to FIG. 4, once the vibration detection element 10 starts to be produced, the flow paths are produced at the glass substrate (step S1).

Then, a quartz plate is polished and patterned to produce an oscillator (step S2). Subsequently, a flow path is produced at the silicon substrate (step S3). The oscillator is then packaged to produce the vibration detection element 10 (step S4). This completes the vibration detection element 10.

Figure 5:
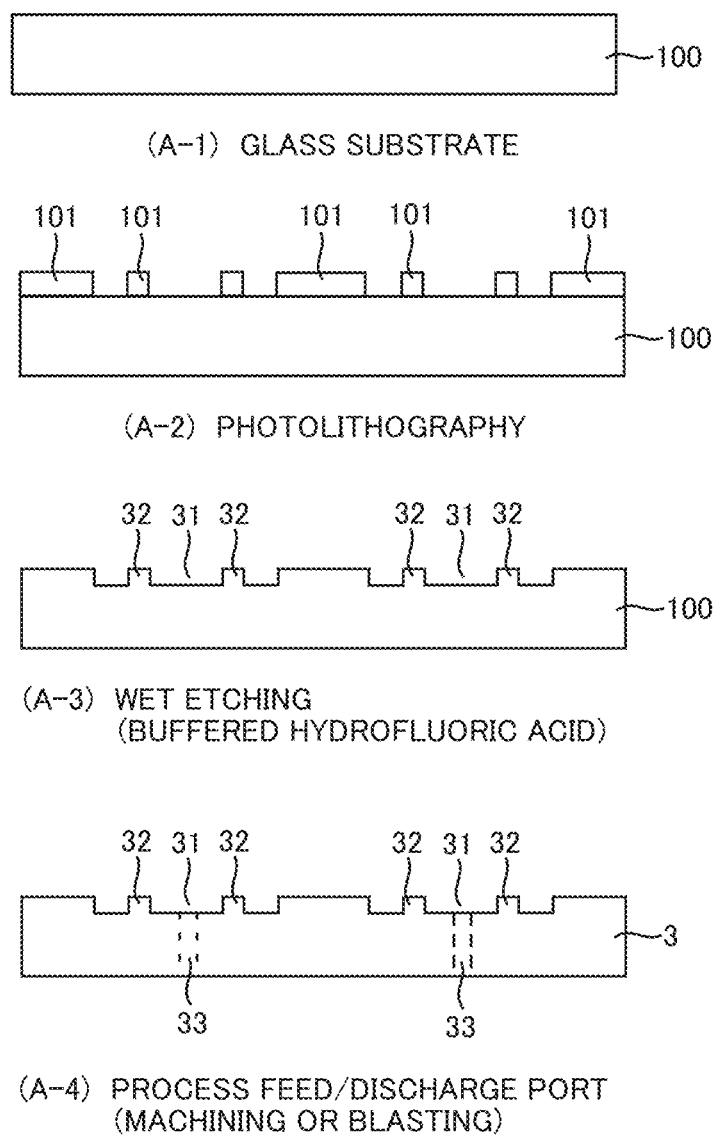
FIG. 5 is a process view for illustrating a detailed process of step S1 illustrated in FIG. 4.

FIG. 5 is a process view for illustrating the detailed process of step S1 in FIG. 4. FIG. 5 shows the detailed process of step S1 in a sectional view taken along line II-II shown in FIG. 1.

With reference to FIG. 5, once a detailed process of step S1 starts, a glass substrate 100 is prepared (step A-1). Then, a resist is applied on one surface of the glass substrate 100 and the applied resist is patterned by photolithography into a resist pattern 101 (step A-2).

Subsequently, using the resist pattern 101 as a mask, the glass substrate 100 is wet-etched with buffered hydrofluoric acid to form recesses 31 and pillars (to form the support members 32) (step A-3).

In steps A-2 and A-3, the part to form the flow paths 7 and 8, the part to form the introduction port 9, and the part to form the discharge port 11 shown in FIG. 1 are also formed.

Thereafter, the feed/discharge port 33 is formed by machining or blasting (step A-4). In this way, the glass substrate 3 is made, which completes the detailed process of step S1.

Figure 6:
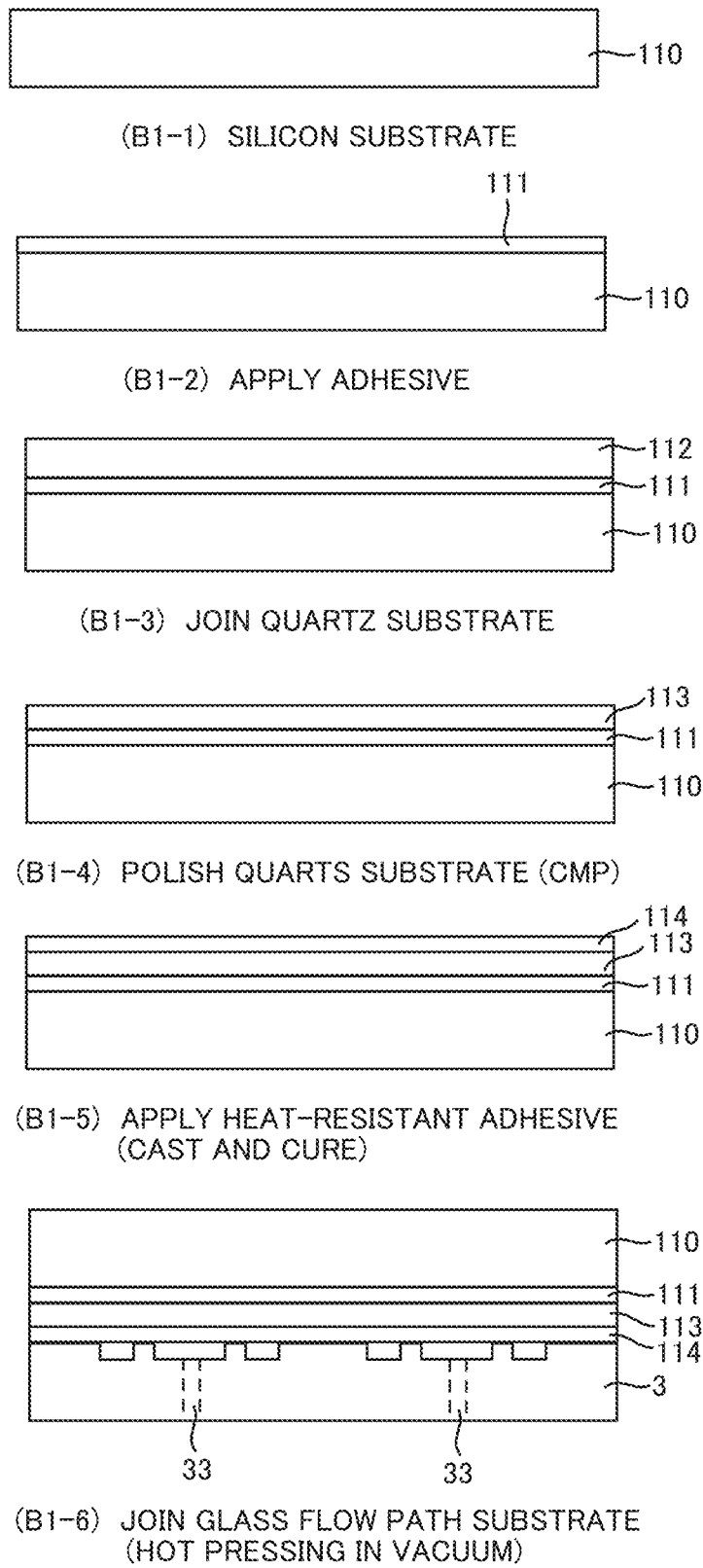
FIG. 6 is a first process view for illustrating a detailed process of step S2 illustrated in FIG. 4.
Figure 7:
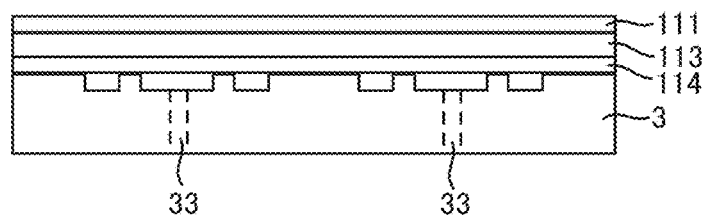
FIG. 7 is a second process view for illustrating the detailed process of step S2 illustrated in FIG. 4.
Figure 7:
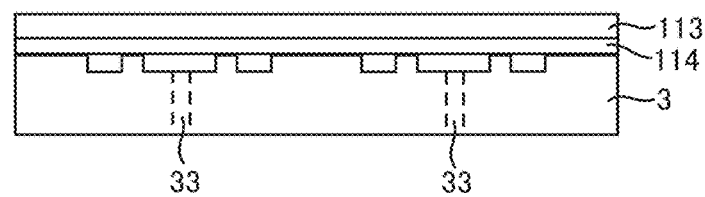
Figure 7:
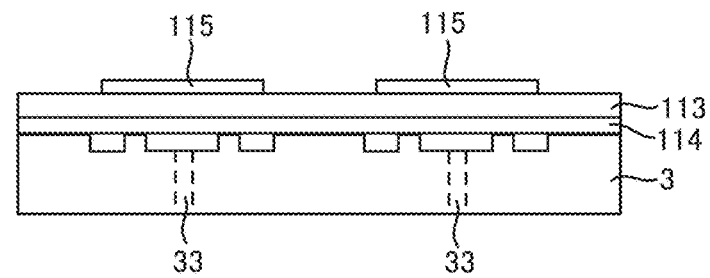
Figure 7:
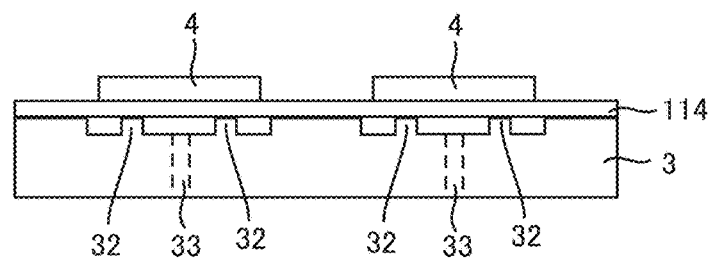
Figure 7:
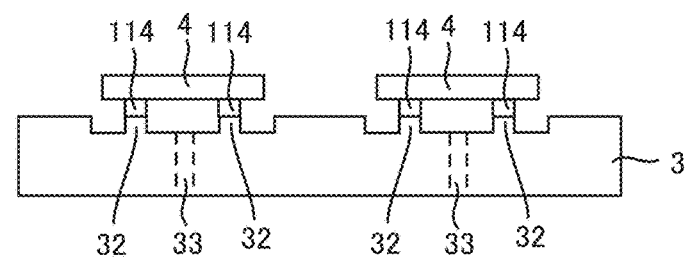

FIGS. 6 and 7 are first and second process views for illustrating the detailed process of step S2 in FIG. 4. FIGS.

6 and 7 illustrate a detailed process of step S2 in a sectional view taken along line II-II shown in FIG. 1.

With reference to FIG. 6, when the detailed process of step S2 starts, a silicon substrate 110 is prepared (step B1-1).

Then, an adhesive 111 is applied on one surface of the silicon substrate 110 (step B1-2). The applied adhesive 111 forms an "adhesive layer." The adhesive 111 is for example made of an epoxy resin. The epoxy resin is a pure resin which does not contain other materials such as metal particles. More specifically, an epoxy-based resin of an organic material or a thin metal film as an inorganic material can be used. The thickness of the applied adhesive 111 may be hundreds of nm. Surface-activated bonding may also be applied, according to which the substrates are directly bonded without an adhesive.

Subsequently, an AT-cut quartz substrate 112 is joined to the silicon substrate 110 with the adhesive 111 (step B1-3).

The AT-cut quartz substrate 112 is then polished to have a desired thickness (such as 3 μm) by chemical mechanical polishing (CMP) (step B1-4).

Then, a heat-resistant adhesive 114 is applied on the surface of the polished quartz plate 113 (step B1-5). For example, a heat-resistant adhesive, TP-424 from Toray Industries, Inc. is used as the heat-resistant adhesive 114. The heat-resistant adhesive contains a polyimide resin, silica, dipropylene glycol methyl ether, and N-methyl-2-pyrrolidone. For example, the content of the polyimide resin is 30-70%, the silica content is 1-10%, the content of dipropylene glycol methyl ether is 30-70%, and the content of N-methyl-2-pyrrolidone is 5-30%. The particle size of silica is tens of nm to hundreds of nm. In this way, the heat-resistant adhesive 114 includes particles having particle sizes in the range from tens of nm to hundreds of nm. The heat-resistant adhesive 114 has a volume change of at most a few percent at 400° C. as compared to the volume at room temperature. The heat-resistant adhesive may be made of a single organic material which does not contain silica.

The heat-resistant adhesive 114 is applied on the surface of quartz plate 113 for example by spin coating and has a thickness of 20 μm. Note that the heat-resistant adhesive 114 may be applied dropwise by a dispenser to the surface of the quartz plate 113.

After applying the heat-resistant adhesive 114, the heat-resistant adhesive 114 is thermally treated for example at a temperature of 350° C. or higher and cured. In this case, the thermal treatment of the heat-resistant adhesive 114 at a temperature of 350° C. or higher promotes imidization of the heat-resistant adhesive 114 as a polyimide-based adhesive, and the solvent is vaporized to become hard from its muddy state in the initial state.

After the heat-resistant adhesive 114 is cured, the temperature of the heat-resistant adhesive 114 is returned to room temperature, and then by hot pressing in a vacuum or in a nitrogen atmosphere, the silicon substrate 110 to which the quartz plate 113 is adhered is joined to the glass substrate 3 produced in step S1 with the heat-resistant adhesive 114 (step B1-6). When hot pressing is performed in a vacuum, for example, the pressure of the atmosphere is 10 kPa or less, the heating temperature during the hot pressing is from 150° C. to 220° C., and the pressure during the hot pressing is from 55.5 kPa to 155 kPa. When hot pressing is performed in a nitrogen atmosphere, the oxygen concentration in the nitrogen atmosphere is 10 ppm or less, and the heating temperature and pressure during the hot pressing are the same as the above. Note that the thickness of the heat-resistant adhesive 114 becomes slightly thinner than 20 μm due to the hot pressing in step B1-6.

Note that steps B1-5 and B1-6 constitute a step joining the glass substrate 3 and the silicon substrate 110 by performing a step that the heat-resistant adhesive 114 is applied on a thin film, followed by curing by thermal treatment, and then returned to room temperature, and heating and pressurizing are again performed thereto.

With reference to FIG. 7, after step (B1-6), the silicon substrate 110 is etched by plasma etching with $XeF_2$ gas or a mixture of $SF_6$ gas and an $O_2$ gas (step B1-7). In this case, the pressure is 10 Pa, the power is 1 kW, and the stage temperature is 20° C. during etching. VPE-4F (manufactured by SAMCO Co., Ltd.) can be used as a plasma etching apparatus using $XeF_2$ gas, and RIE-10NR (manufactured by SAMCO Co., Ltd.) can be used as a plasma etching apparatus using a mixture of $SF_6$ gas and $O_2$ gas.

The surface of the adhesive 111 is then irradiated with high energy oxygen (oxygen radicals) by plasma using $O_2$ gas, which is bonded to the carbon included in the adhesive 111, vaporized and decomposed as $CO_2$ and removed by ashing (step B1-8). In this case, the ashing pressure is 10 Pa, the power is 1 kW, and the stage temperature is 20° C. In this way, the surface of the quartz plate 113 is exposed.

Thereafter, a resist is applied on the surface of the quartz plate 113 and the applied resist is patterned by photolithography into a resist pattern 115 (step B1-9).

Subsequently, using the resist pattern 115 as a mask, the quartz plate 113 is etched by plasma etching with $CHF_3$ gas, so that the oscillator 4 is produced (step B1-10). In this case, the etching pressure is 20 Pa, the power is 100 W, and the stage temperature is 20° C. As a plasma etching apparatus, RIE-800iPC (manufactured by SAMCO Co., Ltd.) can be used.

Then, the heat-resistant adhesive 114 other than between the oscillator 4 and the support members 32 is removed using TOS-02 from Toray Industries, Ltd. as a remover (step B1-11). In this case, the heat-resistant adhesive 114 is removed using a removal agent solution TOS-02. The removal agent TOS-02 is a basic remover containing N-methyl-2-pyrrolidone (NMP), monoethanolamine (MEA), propylene glycol monomethyl ether (PGME), tetramethylammonium hydroxide (TMAH), and water.

For example, the content of N-methyl-2-pyrrolidone (NMP) is from 10% to 50% by weight, the content of monoethanolamine (MEA) is from 10% to 50% by weight, the content of propylene glycol monomethyl ether (PGME) is from 10% to 50% by weight, the content of tetramethylammonium hydroxide (TMAH) is from 0.1% to 10% by weight, and the content of water is from 0.5% to 30% by weight.

The heat-resistant adhesive may be removed by an acidic or organic solution as well as by such a basic solution.

By performing step (B1-11), the oscillator 4 is adhered only to the support members 32 of the glass substrate 3 by the heat-resistant adhesive 114. This completes the detailed process of step S2.

Figure 8:
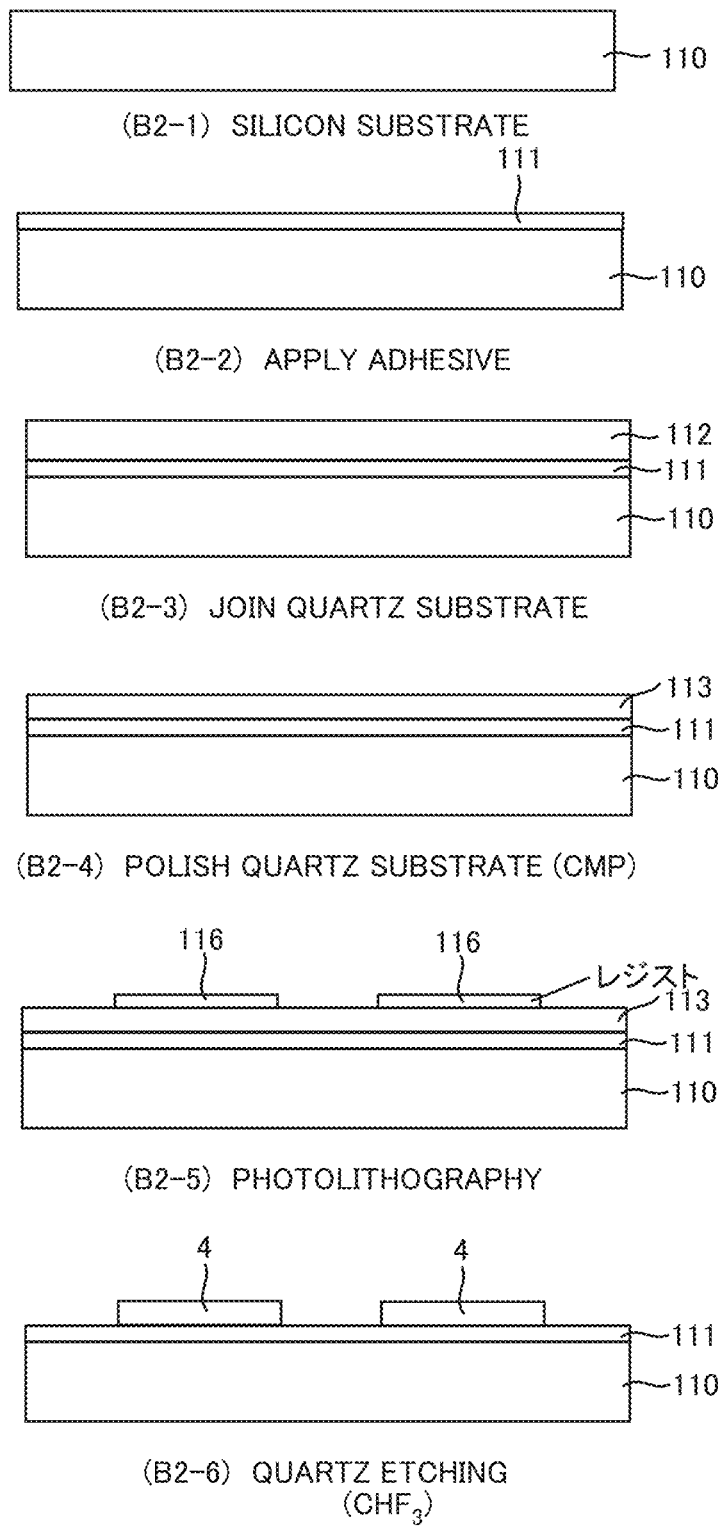
FIG. 8 is a first process diagram illustrating another detailed process of step S2 illustrated in FIG. 4.
Figure 9:
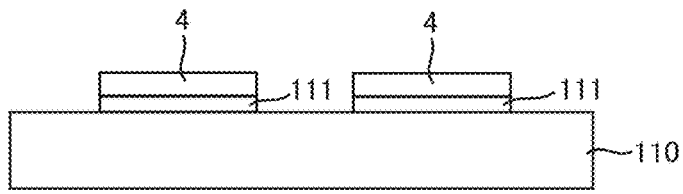
FIG. 9 is a second process view for illustrating another detailed process of step S2 illustrated in FIG. 4.
Figure 9:
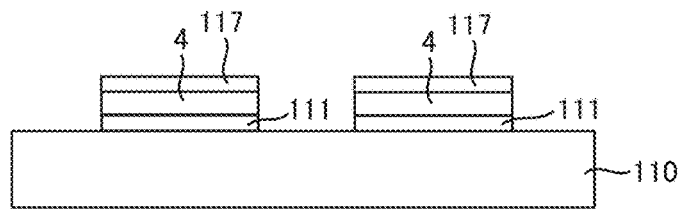
Figure 9:
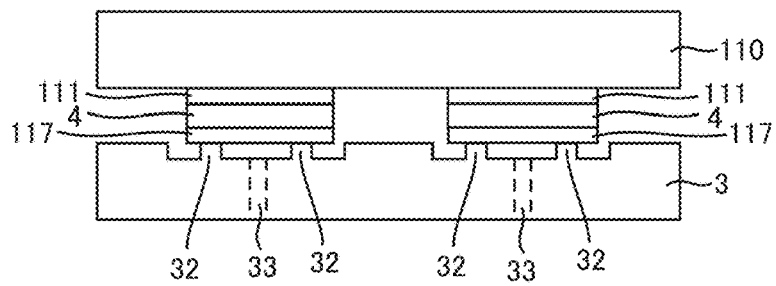
Figure 9:
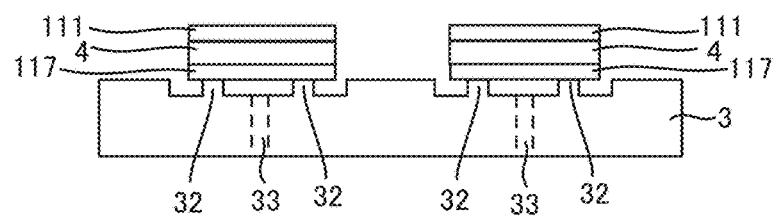
Figure 9:
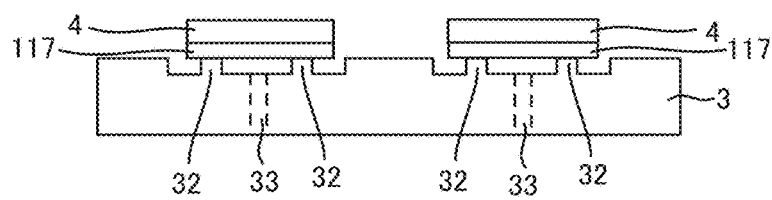

FIGS. 8 and 9 are first and second process views showing another detailed process of step S2 illustrated in FIG. 4. FIGS. 8 and 9 illustrate a detailed process of step S2 in a sectional view taken along line II-II in FIG. 1.

With reference to FIG. 8, when the detailed process of step S2 starts, the same steps as steps B1-1 to B1-4 illustrated in FIG. 6 are performed sequentially (steps B2-1 to B2-4).

After step B2-4, a resist is applied on the surface of the quartz plate 113 and the applied resist is patterned by photolithography into a resist pattern 116 (step B2-5).

Using the resist pattern 116 as a mask, the quartz plate 113 is etched by plasma etching with $CHF_3$ gas, so that the oscillator 4 is produced (step B2-6). In this case, the conditions such as pressure during plasma etching are as described above.

With reference to FIG. 9, after step B2-6, the part of the adhesive 111 which is not in contact with the oscillator 4 is removed by asking with the $O_2$ gas described above (step B2-7).

Then, a heat-resistant adhesive 117 is applied on the surface of the oscillator 4 in the same manner as in step B1-5 in FIG. 6, and the applied heat-resistant adhesive 117 is cured (step B2-8). A typical specific example of the heat-resistant adhesive 117, the application method and thickness are the same as those of the heat-resistant adhesive 114 described above.

Then, by hot pressing in a vacuum or in a nitrogen atmosphere, the silicon substrate 110 to which the oscillator 4 is adhered is joined to the glass substrate 3 produced in step S1 with the heat-resistant adhesive 117 (step B2-9). In this case, the pressure of the atmosphere in performing hot pressing in a vacuum, the heating temperature during the hot pressing, and a typical pressure condition during the hot pressing are as described above. Representative conditions for heating temperature and pressure in hot-pressing in a nitrogen atmosphere are the same as those described above.

Note that steps B2-8 and B2-9 constitute a step joining the glass substrate 3 and the silicon substrate 110 by performing a step that the heat-resistant adhesive 117 is applied on a thin film, followed by curing by thermal treatment, then returned to room temperature, and then heating and pressurizing are again performed.

After step B2-9, the silicon substrate 110 is etched by plasma etching with $XeF_2$ gas or a mixture of $SF_6$ gas and $O_2$ gas (step B2-10). In this case, the conditions such as the pressure during etching are as described above.

The adhesive 111 is then removed by asking with the $O_2$ gas described above, and the surface of the oscillator 4 is exposed (step B2-11). This completes the detailed process of step S2.

Note that in the detailed process of step S2 illustrated in FIGS. 8 and 9, after applying the heat-resistant adhesive 117 on the surface of the oscillator 4 in step B2-8, the applied heat-resistant adhesive 117 may be patterned by photolithographic to leave only the parts opposed to the support members 32 of the glass substrate 3, and then step B2-9 may be performed. This allows the oscillator 4 to be adhered to the support members 32 by the heat-resistant adhesive 117 only at the parts opposed to the support members 32, and the heat-resistant adhesive 117 can be removed easily in step D2-2 in FIG. 15 which will be described. As a result, damages to the oscillator 4 can be further prevented.

Figure 10:
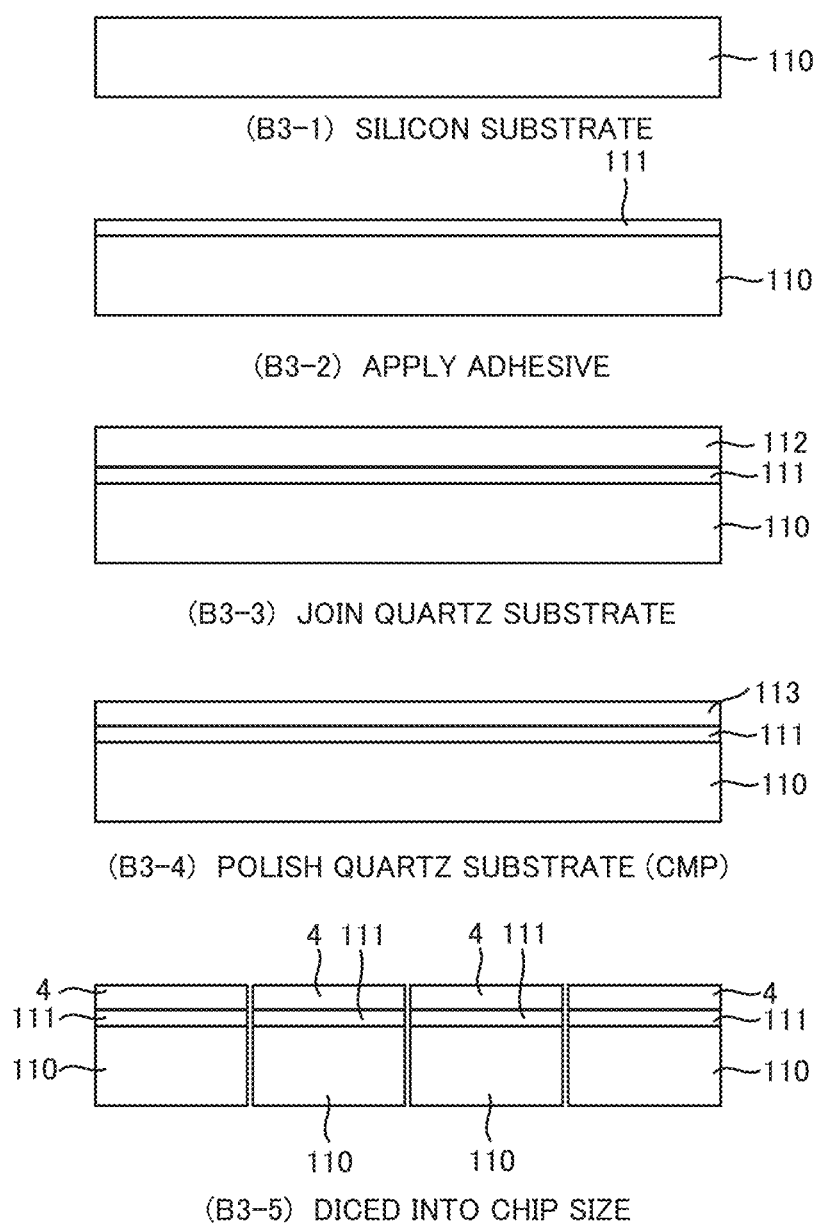
FIG. 10 is a first process view for illustrating a further another detailed process of step S2 illustrated in FIG. 4.
Figure 11:
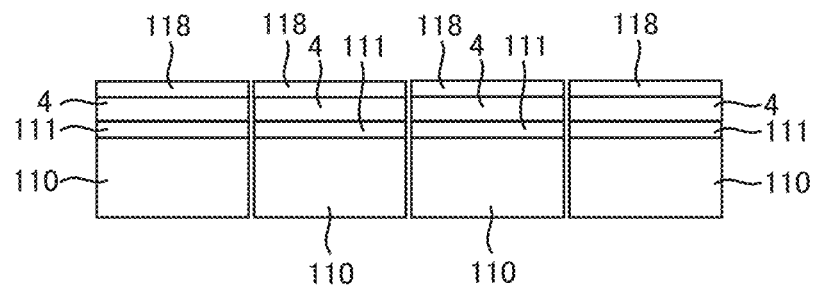
FIG. 11 is a second process view for illustrating a further another detailed process of step S2 illustrated in FIG. 4.
Figure 11:
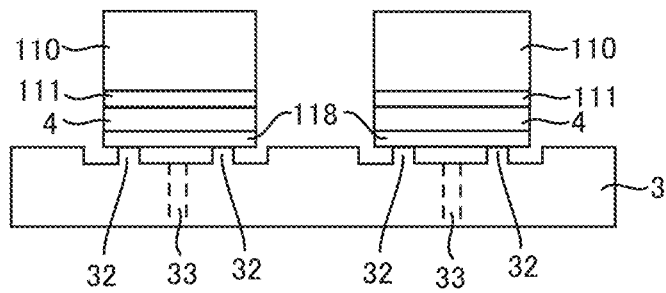
Figure 11:
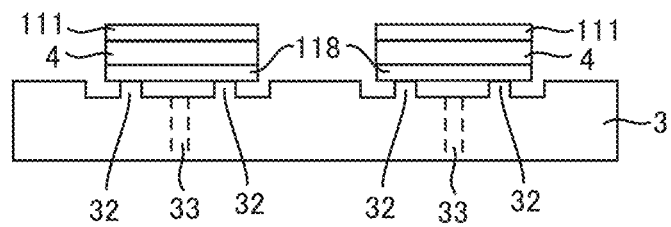
Figure 11:
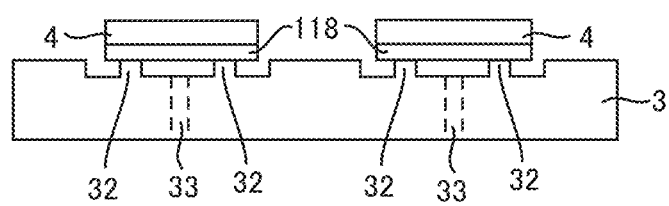

FIGS. 10 and 11 are first and second process views for illustrating yet another detailed process of step S2 in FIG. 4. FIGS. 10 and 11 illustrate the detailed process of step S2 in a sectional view taken along line II-II shown in FIG. 1.

With reference to FIG. 10, as the detailed process of step S2 starts, the same steps as steps B1-1 to B1-4 illustrated in FIG. 6 are performed sequentially (steps B3-1 to B3-4).

The silicon substrate 110 to which the quartz plate 113 is adhered with the adhesive 111 is diced into a chip size. In this case, the quartz plate 113 is diced so that the plate is cut to have a grid-like pattern, when viewed in a plan view from the surface side of the quartz plate 113. In this way, multiple chips each including the silicon substrate 110 and the oscillator 4 adhered thereto with the adhesive 111 are produced (step B3-5).

With reference to FIG. 11, after step B3-5, a heat-resistant adhesive 118 is applied on the surfaces of the multiple oscillators 4 as the chips in the same manner as in step B1-5 in FIG. 6, and the applied heat-resistant adhesive 118 is cured (step B3-6). A specific example of the heat-resistant adhesive 118, the application method, and thickness are the same as those of the heat-resistant adhesive 114 described above.

Then, by hot pressing in a vacuum or in a nitrogen atmosphere, the silicon substrate 110 to which the oscillator 4 is adhered is joined to the glass substrate 3 produced in step S1 with the heat-resistant adhesive 118 (step B3-7). In this case, the pressure of the atmosphere during the hot pressing in a vacuum, the heating temperature during the hot pressing, and the pressure during the hot pressing are as described above. The heating temperature and pressure in hot pressing in a nitrogen atmosphere are the same as those described above.

Note that steps B3-6 and B3-7 constitute a step joining the glass substrate 3 and the silicon substrate 110 by performing a step that the heat-resistant adhesive 118 is applied on a thin film, followed by curing by thermal treatment, and returned to room temperature, and then heating and pressurizing are performed again.

After step B3-7, the silicon substrate 110 is etched by plasma etching with $XeF_2$ gas or $SF_6$ gas and $O_2$ gas (step B3-8). In this case, the conditions such as the pressure during etching are as described above.

The adhesive 111 is then removed by asking with the $O_2$ gas described above, so that the surface of the oscillator 4 is exposed (step B3-9). This completes the detailed process of step S2.

In the detailed process of process S2 illustrated in FIGS. 6 and 7, the part of the quartz plate 113 which is not in contact with the resist pattern 115 is removed (see steps B1-9 and B1-10), and in the detailed process of process S2 illustrated in FIGS. 8 and 9, the part of the quartz plate 113 which is not in contact with the resist pattern 116 is removed (see steps B2-5 and B2-6).

Meanwhile, in the detailed process of step S2 illustrated in FIGS. 10 and 11, a part of the quartz plate 113 is removed only by dicing (see step B3-5).

Therefore, according to the detailed process of step S2 illustrated in FIGS. 10 and 11, the amount of the quartz plate 113 to be removed is minimized, and the quartz plate 113 can be most effectively used.

Since the resist is not used in producing the oscillator 4 from the quartz plate 113, photolithography is not necessary, which can reduce the number of steps.

Figure 12:
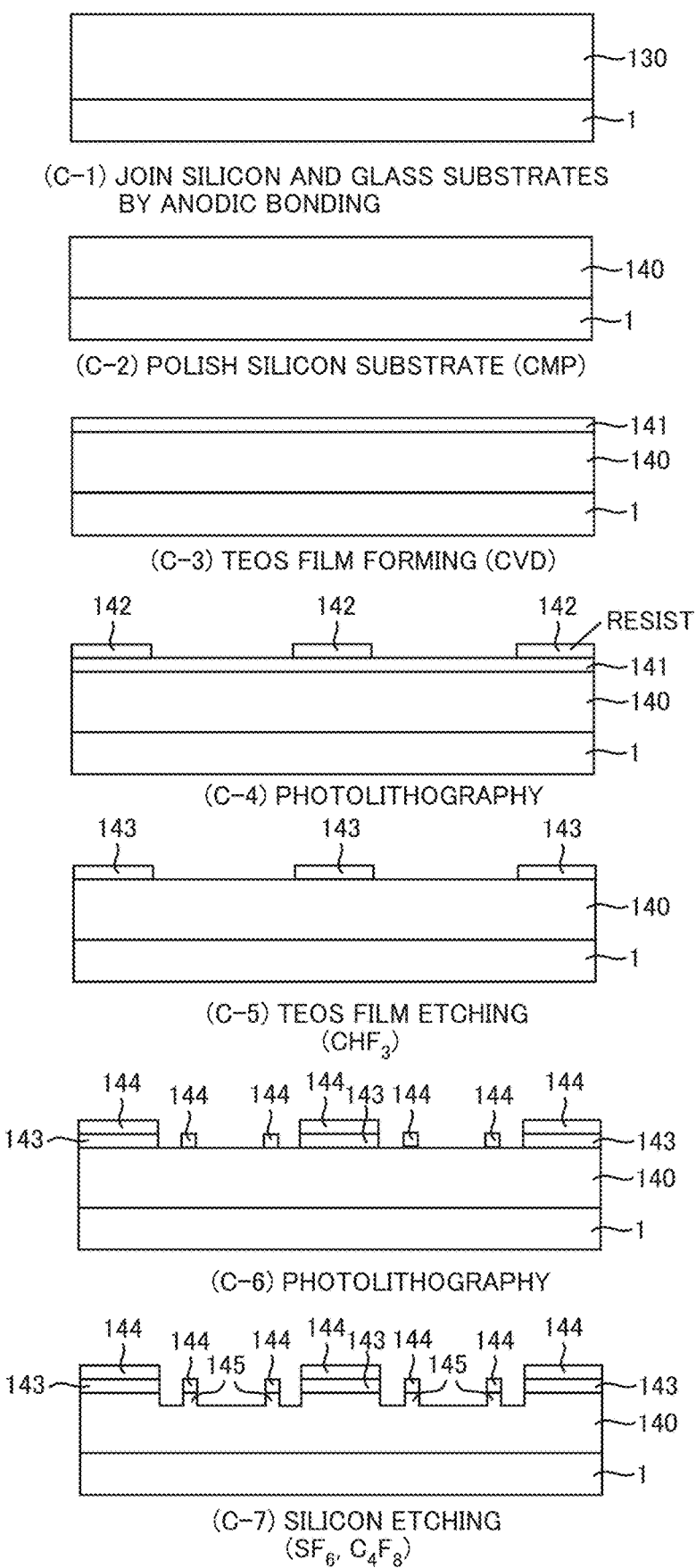
FIG. 12 is a first process view for illustrating a detailed process of step S3 illustrated in FIG. 4.
Figure 13:
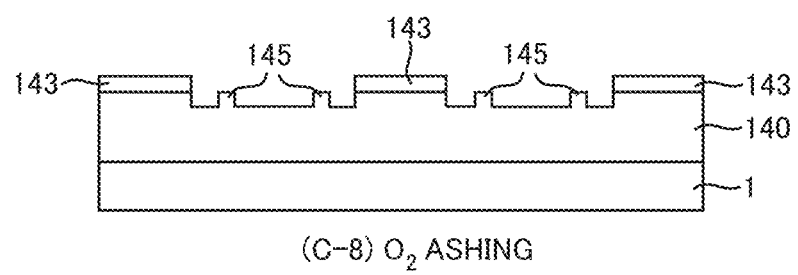
FIG. 13 is a second process view for illustrating a detailed process of step S3 illustrated in FIG. 4.
Figure 13:
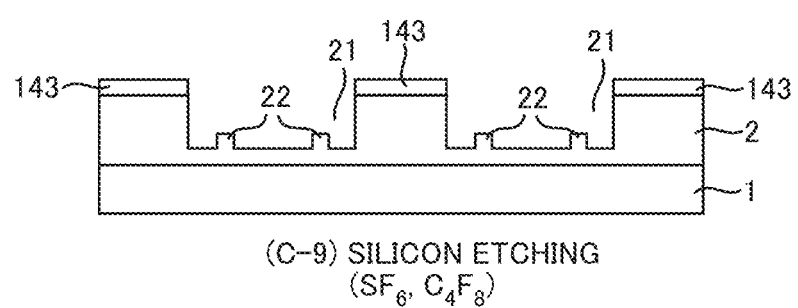
Figure 13:
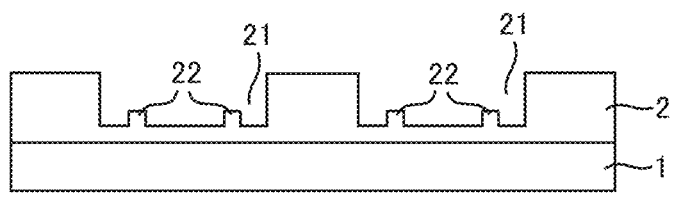

FIGS. 12 and 13 are first and second process views for illustrating a detailed process of step S3 illustrated in FIG. 4. FIGS. 12 and 13 illustrate the detailed process of step S3 in a sectional view taken along line II-II shown in FIG. 1.

With reference to FIG. 12, when the detailed process of step S3 starts, a glass substrate 1 and a silicon substrate 130 are prepared and the glass substrate 1 and the silicon substrate 130 are joined by anodic bonding (step C-1). In this case, the anodic bonding is performed for example by applying a voltage of 600 V at a temperature of 350° C.

The silicon substrate 130 is then polished by CMP to have a desired thickness (for example 60 μm), so that a silicon substrate 140 is produced (step C-2).

Thereafter, a silicon oxide film 141 is formed on the surface of the silicon substrate 140 for example by plasma CVD (Chemical Vapor Deposition) and thermal CVD using TEOS (tetraethyl orthosilicate: $Si(OC_2H_5)_4$) as a source gas (step C-3). Note that the substrate temperature and pressure, etc. for forming a silicon oxide film using TEOS have been known and will be not described. In FIGS. 12 and 13, a silicon oxide film formed using TEOS as a source gas will be referred to as a "TEOS film."

After step C-3, a resist is applied on the surface of the silicon oxide film 141 and the applied resist is patterned by photolithography into a resist pattern 142 on the surface of the silicon oxide film 141 (step C-4).

The silicon oxide film 141 is then etched using the resist pattern 142 as a mask by plasma etching with $CHF_3$ gas, so that a silicon oxide film 143 is formed on the surface of the silicon substrate 140 (step C-5). In this case, the etching pressure is 20 Pa, the power is 100 W, and the stage temperature is 20° C.

The resist is then applied on the surface of the silicon substrate 140 and the silicon oxide film 143, and the applied resist is patterned by photolithography into a resist pattern 144 on the surfaces of the silicon substrate 140 and the silicon oxide film 143 (step C-6).

Subsequently, the step of etching the silicon substrate 140 by plasma etching with $SF_6$ gas using the resist pattern 144 as a mask and the step of coating the sidewalls of the etched silicon substrate 140 by plasma CVD using $C_4H_8$ gas are repeatedly performed in order to etch the silicon substrate 140 (step C-7).

In this case, the pressure in the etching step is 10 Pa, the power is 2 kW, and the stage temperature is 20° C. The pressure in the coating step is 10 Pa, the power is 3 kW, and the stage temperature is 20° C.

With reference to FIG. 13, after step C-7, the resist pattern 144 is removed by asking with the 02 gas described above. In this way, protrusions 145 is formed on a part of the silicon substrate 140 (step C-8).

Then, the etching step using the silicon oxide film 143 as a mask and the coating step described above are repeatedly performed to further etch the silicon substrate 140 (step C-9). In this case, since the sidewalls of the etched silicon substrate 140 are coated, a part of the silicon substrate 140 which is not coated by the silicon oxide film 143 is etched only in the thickness-wise direction of the silicon substrate 140. In this way, the silicon substrate 2 having deep recesses 21 in the thickness-wise direction of the silicon substrate 2 and support members 22 formed in the recess 21 is formed. Note that the depth of the recess 21 formed in step C-9 is for example 40 μm.

Then, the silicon oxide film 143 is removed by buffered hydrofluoric acid (step C-10). This completes the detailed process of step S3.

Since in step C-9, the silicon substrate 140 is etched only in the thickness-wise direction, the height of the protrusion 145 formed in step C-8 is equal to the height of the support member 22 formed in step C-9. Therefore, in step C-8, the height of the support member 22 to be eventually formed is set.

Note that steps C-3 to C-10 also provide the part to be the flow paths 7 and 8, the part to be the introduction port 9, and the part to be the discharge port 11 shown in FIG. 1.

Figure 14:
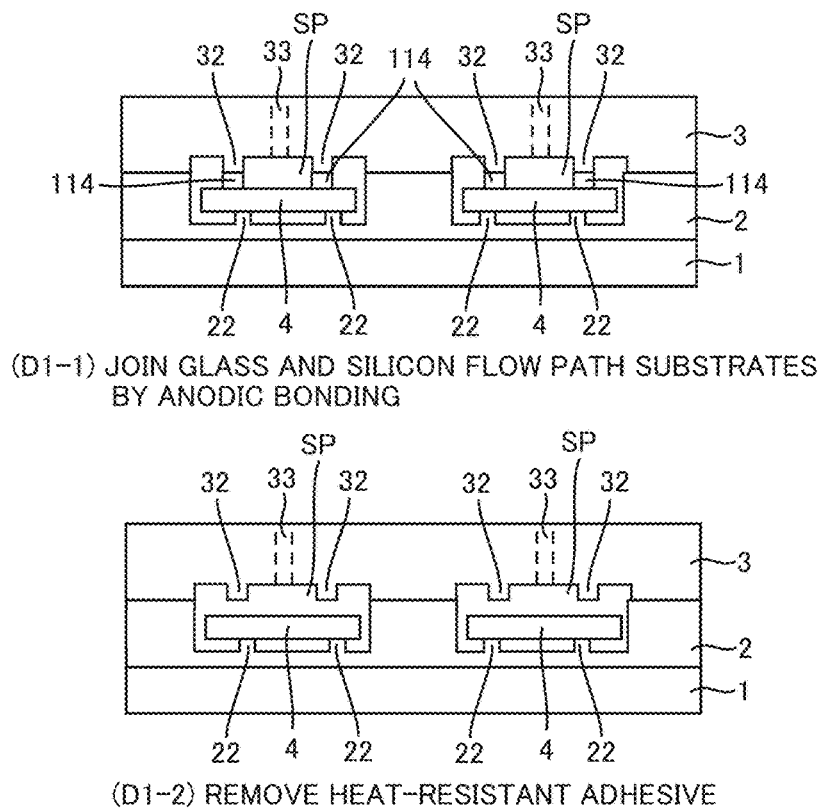
FIG. 14 is a view for illustrating a detailed process of step S4 illustrated in FIG. 4.

FIG. 14 is a view for illustrating a detailed process of step S4 illustrated in FIG. 4. FIG. 14 shows the detailed process of step S4 in a sectional view taken along line II-II shown in FIG. 1.

With reference to FIG. 14, when the detailed process of step S4 starts, the glass substrate 3 is disposed on the glass substrate 1 and the silicon substrate 2 such that the oscillator 4 adhered to the support members 32 of the glass substrate 3 with the heat-resistant adhesive 114 as shown in step B1-11 in FIG. 7 is in contact with the support members 22 in the recess 21, and the silicon substrate 2 and the glass substrate 3 are joined by anodic bonding (step D1-1). In this case, the anodic bonding is performed for example by applying a voltage of 600 V at a temperature of 350° C. In this way, the space portion SP is formed.

Then, the above-described remover is filled into the space portion SP from the feed/discharge port 33, and the heat-resistant adhesive 114 is removed (step D1-2). In this case, once the heat-resistant adhesive 114 is removed, the remover is discharged from the feed/discharge port 33. This completes the detailed process of step S4.

When step D1-2 is performed, the oscillator 4 is in contact with either of the support members 22 and 32 without being fixed to any of the support members 22 and 32 in the space portion SP. Therefore, the oscillator 4 can vibrate in the space portion SP.

As shown in step D1-1, the heat-resistant adhesive 114 is applied only on the support members 32 and therefore in step D1-2, the amount of the heat-resistant adhesive 114 to be removed can be minimized when the heat-resistant adhesive is removed, and the heat-resistant adhesive 114 can be easily removed while damage to the oscillator 4 is suppressed.

Figure 15:
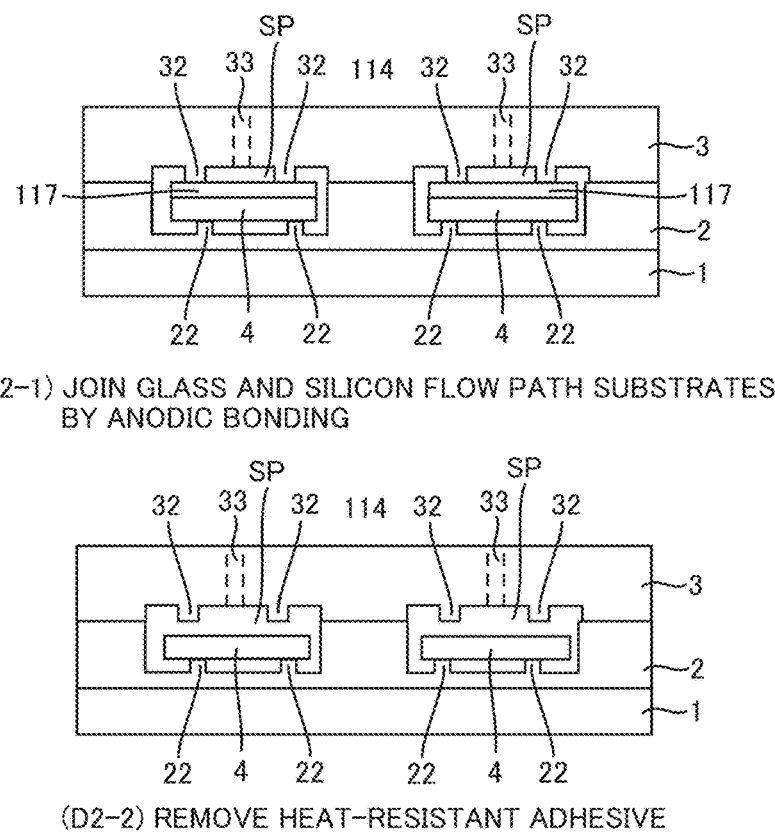
FIG. 15 is a view for illustrating another detailed process of step S4 illustrated in FIG. 4.

FIG. 15 is a view for illustrating another detailed process of step S4 illustrated in FIG. 4. FIG. 15 shows the detailed process of step S4 in a sectional view taken along line II-II shown in FIG. 1.

With reference to FIG. 15, as the detailed process of step S4 starts, the glass substrate 3 is disposed on the glass substrate 1 and the silicon substrate 2 such that the oscillator 4 adhered to the support members 32 of the glass substrate 3 with the heat-resistant adhesive 117 as shown in step B2-11 in FIG. 9 is in contact with the support members 22 in the recesses 21, and the silicon substrate 2 and the glass substrate 3 are joined by anodic bonding (step D2-1). In this case, the anodic bonding is performed for example by applying a voltage of 600 V at a temperature of 350° C. In this way, the space portion SP is formed.

Then, the above-described remover is filled into the space portion SP from the feed/discharge port 33, and the heat-resistant adhesive 117 is removed (step D2-2). In this case, once the heat-resistant adhesive 117 is removed, the remover is discharged from the feed/discharge port 33. This completes the detailed process of step S4.

When step D2-2 is performed, the oscillator 4 is in contact with either of the support members 22 and 32 without being fixed to any of the support members 22 and 32 in the space portion SP. In this way, the oscillator 4 can vibrate in the space portion SP.

When the vibration detection element 10 is manufactured using the oscillator 4 adhered to the support members 32 of the glass substrate 3 by the heat-resistant adhesive 118 as shown in step B3-9 of FIG. 11, the detailed process of step S4 is performed according to steps D2-1 and D2-2 shown in FIG. 15. In this case, in step D2-2, the heat-resistant adhesive 118 is removed by the above-described remover.

By the above-described manufacturing steps, the vibration detection element 10 having a fundamental resonance frequency of at least 1 GHz (when the thickness of the oscillator 4 is 1.7 μm or less) can be produced. Therefore, when the vibration detection element 10 is used as a biosensor, the theoretical sensitivity can be about as high as 80,000 times that of an existing quartz oscillator biosensor from Biolin Scientific.

In the steps for manufacturing the vibration detection element 10 described above, the oscillator 4 is produced by polishing and patterning (or dicing) the quartz plate 112 fixed to the silicon substrate 110 (see steps B1-3 and B1-4 in FIG. 6, steps B1-8 and B1-9 in FIG. 7, steps B2-3 to B2-6 in FIG. 8, and steps B3-3 to B3-5 in FIG. 10).

The oscillator 4 is disposed in contact with the support members 22 of the silicon substrate 2 while being fixed to the glass substrate 3, and then the silicon substrate 2 is joined to the glass substrate 3 by anodic bonding, and the heat-resistant adhesives 114, 117, and 118 are removed (see steps D1-1 and D1-2 in FIG. 14 and steps D2-1 and D2-2 in FIG. 15).

Therefore, an oscillator 4 having a thickness of less than 10 µm can be made without damages. In the steps for manufacturing the vibration detection element 10, since the oscillator 4 is not handled alone by tweezers or the like, even if the thickness of the oscillator 4 is less than 10 µm, the vibration detection element 10 can be manufactured while preventing damages to the oscillator 4.

In this way, the method for manufacturing the vibration detection element 10 according to an embodiment of the present invention has features that the heat-resistant adhesives 114, 117, and 118 are used as spacers and then the heat-resistant adhesives 114, 117, and 118 are removed.

According to conventional methods, heat-resistant adhesives are used as sealants, and the adhesives once formed are not removed thereafter. In other words, the heat-resistant adhesive is a permanent film.

However, according to the embodiment of the present invention, after the quartz plate is patterned (or diced) to have a desired shape, the quartz plate is eventually sealed in the space portion SP as the oscillator 4, and then the heat-resistant adhesives 114, 117, and 118 are removed.

Therefore, the removal of the heat-resistant adhesives can hardly be conceived in conventional methods.

Various materials were studied, but when materials other than heat-resistant adhesives were used, the materials became carbonized at the stage of thermal treatment and could not be removed successfully.

As for the removal of heat-resistant adhesives, the combinations of heat-resistant adhesives and removers are crucial. According to the embodiment of the present invention, the heat-resistant adhesives 114, 117, and 118 are removed while the oscillator 4 is enclosed in the space portion SP, and then the oscillator 4 is supported by the support members 22 (or support members 32).

More specifically, until the heat-resistant adhesives 114, 117, 118 are removed, the oscillator 4 is fixed, and the removal of the adhesives 114, 117, and 118 allows the oscillator 4 to contact the support members 22 (or support members 32) and vibrate.

The heat-resistant adhesives 114, 117, and 118 are soluble in the remover solution, and the remover solution is discharged from the feed/discharge port 33, so that the remover solution does not remain in the space portion SP in which the oscillator 4 is disposed. Therefore, even if the thickness of the oscillator 4 is less than 10 µm, only the oscillator 4 can be enclosed in the space portion SP.

The steps shown in FIGS. 8 and 9 are preferable over the steps shown in FIGS. 6 and 7 for the following reason.

In the steps illustrated in FIGS. 6 and 7, the heat-resistant adhesive 114 is applied on the entire surface of the quartz plate 113 (see step B1-5).

Meanwhile, in the steps illustrated in FIGS. 8 and 9, the heat-resistant adhesive 117 is applied only on the oscillator 4 after patterning and is not applied on any part other than the oscillator 4 (see step B2-8). More specifically, the heat-resistant adhesive 117 is applied only at the necessary part.

Furthermore, as described above, the heat-resistant adhesive 117 may be formed by photolithography only at a part of the oscillator 4 in contact with the support members 32.

Therefore, using the steps shown in FIGS. 8 and 9, the region to which the heat-resistant adhesive 117 is applied can be limited to the minimum necessary area.

As a result, in the steps illustrated in FIGS. 8 and 9, the heat-resistant adhesive 117 can be easily removed, so that damages to the oscillator 4 can be prevented.

In the steps illustrated in FIGS. 10 and 11, since the heat-resistant adhesive 118 is applied only to the oscillator 4 after dicing (see step B3-6), the steps illustrated in FIGS. 10 and 11 can also provide the same advantageous effects as the steps illustrated in FIGS. 8 and 9.

In step C-7, a sharp recess can be formed by repeatedly performing plasma etching with $SF_6$ gas and coating with $C_4H_8$ gas.

The heat-resistant adhesive 114 is removed in step D1-2, and the heat-resistant adhesives 117 and 118 are removed in step D2-2. As a result, the distance between the oscillator 4 and the support members 32 can be adjusted by the thicknesses of the heat-resistant adhesives 114, 117, and 118.

According to the embodiment of the present invention, when steps D1-1 and D1-2 shown in FIG. 14 are performed, the sum $d_t$ of the thickness of the heat-resistant adhesive 114 and the thickness of the oscillator 4 needs only be equal to or less than the distance L from the surface of the silicon substrate 2 to the tip end of the support member 22. When the sum $d_t$ is equal to the distance L, the oscillator 4 contacts the support members 22 in step D1-1 in FIG. 14. When the sum $d_t$ is less than the distance L, there is a gap between the oscillator 4 and the support members 22 in step D1-1 in FIG. 14. When such a gap exists between the oscillator 4 and the support members 22, the oscillator 4 is supported by the support members 22 in the space portion SP because the oscillator 4 contacts the support member 22 as the heat-resistant adhesive 114 is removed in step D1-2 of FIG. 14. Therefore, when the sum $d_t$ is equal to or less than the distance L, the oscillator 4 is supported by the support members 22.

When steps D2-1 and D2-2 shown in FIG. 15 are performed, the sum of the thickness of the heat-resistant adhesive 117 and the thickness of the oscillator 4 needs only be equal to or less than the distance L, and the sum of the thickness of the heat-resistant adhesive 118 and the thickness of the oscillator 4 needs only be equal to or less than the distance L.

Figure 16:
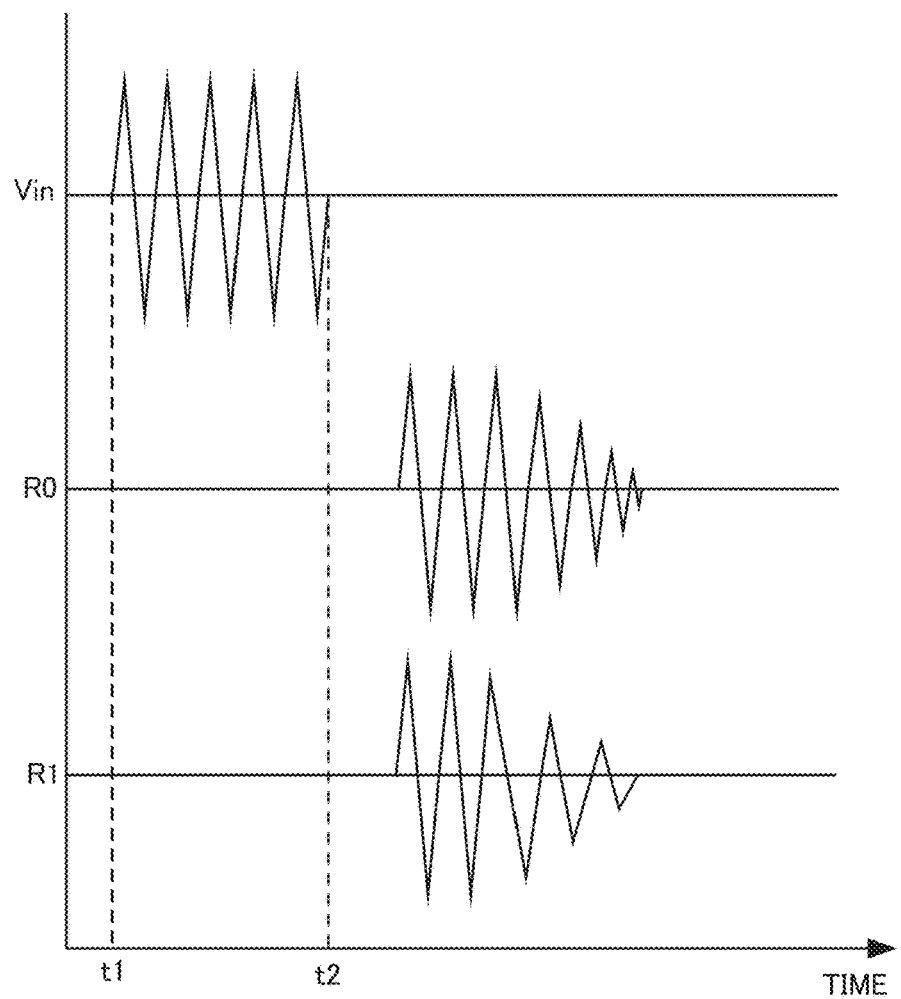
FIG. 16 is a timing chart for input voltage and a received signal.
Figure 17:
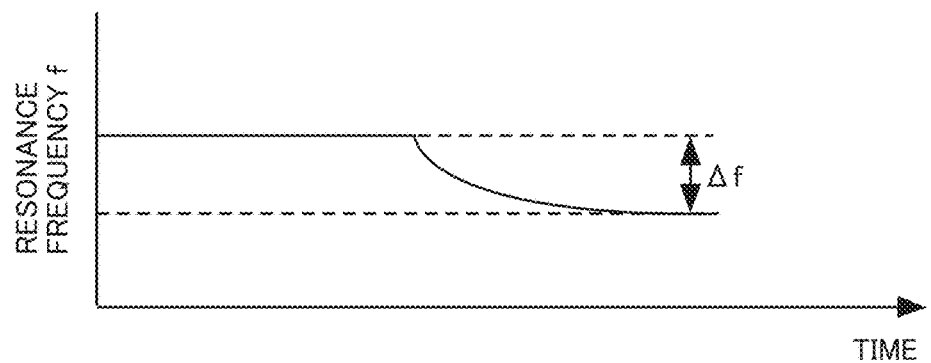
FIG. 17 is a timing chart for a resonant frequency.

FIG. 16 is a timing chart for input voltage Vin and a reception signal R. FIG. 17 is a timing chart for a resonance frequency.

With reference to FIGS. 16 and 17, a method for detecting a detection object in the vibration detection element 10 will be described. When a detection object is detected, an application circuit (not shown) applies input voltage Vin in an oscillatory waveform to the antenna 5 from timing t1 to timing t2. The application circuit stops applying the input voltage Vin to the antenna 5 after timing t2.

Then, the antenna 5 applies an oscillatory electric field E generated in response to the input voltage Vin to the oscillator 4 from timing t1 to timing t2.

The oscillator 4 resonates by the inverse piezoelectric effect when the oscillatory electric field E is applied, so that a potential distribution is generated at the surface.

The antenna 6 then receives the potential distribution generated at the surface of the oscillator 4 as a reception signal R in an oscillatory waveform. In this case, the antenna 6 receives a reception signal R0 in an oscillatory waveform when the detection object is not attached to the oscillator 4, and receives a reception signal R1 in an oscillatory waveform when the detection object is attached to the oscillator 4. The antenna 6 outputs the received signals R0 and R1 to a detection circuit (not shown).

The detection circuit detects the resonance frequency f0 of the reception signal R0 upon receiving the reception signal R0 from the antenna 6. Upon receiving the reception signal R1 from the antenna 6, the detection circuit detects the resonance frequency f1 (<f0) of the received reception signal R1. The detection circuit detects the change amount Δf=f0−f1 in the resonance frequency and detects the attachment of the detection object to the oscillator 4.

Note that the oscillation/detection method shown in FIG. 16 is only one example. For example, the resonance frequencies can also be measured by measuring the transmission response (S12 or S21) and the reflection response (S11 or S22) using a network analyzer.

When the detection object is attached to the oscillator 4, the mass of the oscillator 4 increases, so that the resonance frequency f1 of the oscillator 4 decreases as compared to the case in which the detection object is not attached to the oscillator 4.

Therefore, the detection circuit receives the reception signal R from the antenna 6 after the input voltage Vin is applied to the antenna 5, detects the resonance frequency f0 from the reception signal R when the detection object is not attached to the oscillator 4, and detects the resonance frequency f which gradually changes to the resonance frequency f1 when the detection object is attached to the oscillator 4 (see FIG. 17). The detection circuit detects the change amount Δf=f0−f1 in the resonance frequency f and detects the attachment of the detection object to the oscillator 4.

When the resonance frequency of oscillator 4 is f, the mass of oscillator 4 is m, and the change in the mass of oscillator 4 (which is equal to the mass of the detection object) is Δm, the change amount Δf in the resonance frequency of oscillator 4 is expressed by the following equation.

$$\Delta f = f \cdot \Delta m / m \quad (1)$$

In this way, the change amount Δf in the resonance frequency is proportional to the change amount Δm in the mass of the oscillator 4, i.e., the mass of the detection object and inversely proportional to the mass m of the oscillator 4. Therefore, as the mass of the detection object increases or as the mass (=thickness) of the oscillator 4 decreases, the change amount Δf in the resonance frequency f increases and the attachment of the detection object to the oscillator 4 is more easily detected.

In the vibration detection element 10, the detection object is detected by the method described above while a liquid for inspection is introduced into the space portion SP through the introduction port 9 and the flow path 7, and the liquid for inspection is discharged from the space portion SP through the flow path 8 and the discharge port 11, in other words, while the liquid for inspection is circulated.

In this case, since the oscillator 4 only contacts the support members 22 or the support members 32 as described above, the oscillator 4 freely vibrates when an electromagnetic field is applied by the antenna 5. Therefore, the detection object can be detected while stable vibration of the oscillator 4 is secured.

Although in the foregoing description, the vibration detection element 10 includes the substrate 1 and 3 made of glass and the substrate 2 made of silicon, the vibration detection element 10 may also include a substrate of the same type other than the above according to an embodiment of the present invention.

In the foregoing description, the quartz plate is polished and patterned in order to produce the oscillator 4, while, in general, a piezoelectric plate may be polished and patterned to have a desired thickness and a shape in order to produce the oscillator 4 according to the embodiment of the present invention.

According to the above-described embodiment, a method for manufacturing a vibration detection element may include a first step including joining a first substrate having an oscillator adhered to a first support member protruding from a bottom surface of a first recess thereof with heat-resistant adhesive and a second substrate having a second support member protruding from a bottom surface of a second recess so that the oscillator is opposed to the second support member, and a second step including removing the heat-resistant adhesive after the first step.

With the first step and the second step, while being adhered to the first support member by a heat-resistant adhesive, the oscillator is disposed in a space composed of first and second recesses and supported by the first support member or the second support member by removing the heat-resistant adhesive. As a result, the oscillator does not have to be moved using tweezers or the like until the oscillator is enclosed in the space, so that damages to the oscillator can be prevented.

According to the embodiment of the present invention, a method for manufacturing a vibration detection element may preferably include a first step including forming a first recess and a first support member protruding from a bottom surface of the first recess at a first substrate, a second step including joining a second substrate having an oscillator adhered thereto and a surface of the first substrate with a heat-resistant adhesive applied on the surface of the oscillator, adhering the oscillator to the first support member with the heat-resistant adhesive, then removing the second substrate, and exposing a surface of the oscillator opposite to the surface on which the heat-resistant adhesive is applied, a third step including forming a second recess opposed to the first recess and a second support member protruding from a bottom surface of the second recess at a third substrate, a fourth step joining the first substrate having the oscillator attached to the first support member of the first substrate with the heat-resistant adhesive and the third substrate so that the oscillator is disposed in a space composed of the first and second recesses, and a fifth step including removing the heat-resistant adhesive after the fourth step.

With the first step to the fifth step, the oscillator is adhered to the first support member of the first substrate while being fixed to the second substrate, is disposed in the space while being adhered to the first support member of the first substrate, and is in contact with the first support member or the second support member by joining the first substrate and the third substrate and then removing the heat-resistant adhesive. As a result, the oscillator does not have to be moved using tweezers or the like until the oscillator is enclosed in the space, so that damages to the oscillator can be prevented.

Furthermore, a vibration detection element may include a substrate including a space portion having a first surface and a second surface opposed to the first surface, a first support member protruding from the first surface to the second surface of the space portion, a second support member protruding from the second surface to the first surface of the space portion, and an oscillator disposed in contact with the first support member or the second support member to be capable of vibrating in the space portion and having a thickness less than 10 μm, the first and second support members each including multiple supports which prevent the oscillator from contacting the first surface or the second surface.

This is because when the oscillator is prevented from contacting the first surface or the second surface, the oscillator can vibrate freely.

It is to be understood that the embodiments disclosed herein are illustrative in every respect and not restrictive. The scope of the invention is defined by the appended claims rather than by the description preceding them, and all modifications that fall within the scope of claims and equivalence thereof are intended to be embraced by the claims.

INDUSTRIAL APPLICABILITY

The present invention is applied to a vibration detection element and a method for manufacturing the same.

The invention claimed is:

1. A method for manufacturing a vibration detection element, comprising:
   a first step including joining a first substrate having an oscillator adhered with a heat-resistant adhesive to a first support member protruding from a bottom surface of a first recess of the first substrate and a second substrate having a second support member protruding from a bottom surface of a second recess of the second substrate so that the oscillator is opposed to the second support member; and
   a second step removing the heat-resistant adhesive after the first step.

2. The method for manufacturing a vibration detection element according to claim 1, wherein the first step comprises:
   a first sub step producing the first substrate having the oscillator adhered to the first support member with the heat-resistant adhesive using a third substrate to which the oscillator is adhered; and
   a second sub step joining the first substrate and the second substrate after the first sub step so that the oscillator is opposed to the second support member.

3. The method for manufacturing a vibration detection element according to claim 2, wherein the first sub step comprises:
   a sub step A forming the first recess and the first support member at the first substrate; and
   a sub step B including adhering the oscillator to the third substrate, applying the heat-resistant adhesive on an exposed surface of the oscillator, and adhering the oscillator to the first support member with the applied heat-resistant adhesive, and
   the second sub step comprises:
   a sub step C forming the second recess and the second support member at the second substrate; and
   a sub step D joining the first substrate and the second substrate after the sub step B so that the exposed surface of the oscillator is opposed to the second support member.

4. The method for manufacturing a vibration detection element according to claim 3, wherein in the sub step D, the first substrate and the second substrate are joined so that the exposed surface of the oscillator is opposed to the second support member in a space formed by the first and second recesses.

5. The method for manufacturing a vibration detection element according to claim 4, wherein the sub step B comprises:
   a sub step B-1 adhering a piezoelectric plate to the third substrate by an adhesive layer;
   a sub step B-2 polishing the piezoelectric plate into a desired thickness;
   a sub step B-3 including applying the heat-resistant adhesive on a surface of the polished piezoelectric plate after the sub step B-2 and curing the applied heat-resistant adhesive;
   a sub step B-4 joining the first substrate and the second substrate by hot pressing after the sub step B-3 so that the heat-resistant adhesive is in contact with a surface of the first substrate and a surface of the first support member;
   a sub step B-5 removing the third substrate and the adhesive layer after the sub step B-4; and
   a sub step B-6 including patterning the polished piezoelectric plate into a desired shape and producing the oscillator adhered to the first support member with the heat-resistant adhesive after the sub step B-5.

6. The method for manufacturing a vibration detection element according to claim 4, wherein the sub step B comprises:
   a sub step B-1 including adhering the piezoelectric plate on a surface of the third substrate by an adhesive layer, polishing the adhered piezoelectric plate into a desired thickness, and patterning the piezoelectric plate into a desired shape;
   a sub step B-2 including applying a heat-resistant adhesive on a surface of the oscillator and curing the applied heat-resistant adhesive;
   a sub step B-3 joining the first substrate and the third substrate by hot pressing after the sub step B-2 so that the oscillator is positioned on the first support member; and
   a sub step B-4 removing the third substrate and the adhesive layer after the sub step B-3.

7. The method for manufacturing a vibration detection element according to claim 3, wherein the sub step B comprises:
   a sub step B-1 adhering a piezoelectric plate to the third substrate by an adhesive layer;
   a sub step B-2 polishing the piezoelectric plate into a desired thickness;
   a sub step B-3 including applying the heat-resistant adhesive on a surface of the polished piezoelectric plate after the sub step B-2 and curing the applied heat-resistant adhesive;
   a sub step B-4 joining the first substrate and the second substrate by hot pressing after the sub step B-3 so that the heat-resistant adhesive is in contact with a surface of the first substrate and a surface of the first support member;
   a sub step B-5 removing the third substrate and the adhesive layer after the sub step B-4; and
   a sub step B-6 including patterning the polished piezoelectric plate into a desired shape and producing the oscillator adhered to the first support member with the heat- resistant adhesive after the sub step B-5.

8. The method for manufacturing a vibration detection element according to claim 7, wherein the adhesive layer includes an organic material or an inorganic material.

9. The method for manufacturing a vibration detection element according to claim 7, wherein the hot pressing is performed in a nitrogen atmosphere or in a vacuum.

10. The method for manufacturing a vibration detection element according to claim 3, wherein the sub step B comprises:
- a sub step B-1 including adhering the piezoelectric plate on a surface of the third substrate by an adhesive layer, polishing the adhered piezoelectric plate into a desired thickness, and patterning the piezoelectric plate into a desired shape;
- a sub step B-2 including applying a heat-resistant adhesive on a surface of the oscillator and curing the applied heat-resistant adhesive;
- a sub step B-3 joining the first substrate and the third substrate by hot pressing after the sub step B-2 so that the oscillator is positioned on the first support member; and
- a sub step B-4 removing the third substrate and the adhesive layer after the sub step B-3.

11. The method for manufacturing a vibration detection element according to claim 10, wherein the sub step B further comprises a sub step B-5 patterning the heat-resistant adhesive after the sub step B-2 so that only the part of the heat-resistant adhesive opposed to the first support member remains, and the sub step B-3 is performed after the sub step B-5.

12. The method for manufacturing a vibration detection element according to claim 11, wherein the adhesive layer includes an organic material or an inorganic material.

13. The method for manufacturing a vibration detection element according to claim 12, wherein the hot pressing is performed in a nitrogen atmosphere or in a vacuum.

14. The method for manufacturing a vibration detection element according to claim 11, wherein the hot pressing is performed in a nitrogen atmosphere or in a vacuum.

15. The method for manufacturing a vibration detection element according to claim 10, wherein the adhesive layer includes an organic material or an inorganic material.

16. The method for manufacturing a vibration detection element according to claim 10, wherein the hot pressing is performed in a nitrogen atmosphere or in a vacuum.

17. The method for manufacturing a vibration detection element according to claim 1, wherein the heat-resistant adhesive includes a single organic material or an organic material containing particles having a particle size from tens of nm to hundreds of nm.

18. The method for manufacturing a vibration detection element according to claim 1, wherein in the second step, the heat-resistant adhesive is removed by one of a basic solution, an acidic solution, and an organic solution.

* * * * *